United States Patent
O'Rourke et al.

[11] 4,180,199
[45] Dec. 25, 1979

[54] MASS SOLDERING CONTROL SYSTEM

[75] Inventors: Harold T. O'Rourke, Milford; Warren G. Abbott, Londonberry, both of N.H.

[73] Assignee: Hollis Engineering, Inc., Nashua, N.H.

[21] Appl. No.: 881,435

[22] Filed: Feb. 27, 1978

[51] Int. Cl.$^2$ .................... H05K 3/34; B23K 3/00
[52] U.S. Cl. ...................... 228/102; 228/9; 228/103; 228/180 R; 340/201 R
[58] Field of Search .............. 228/103, 180 R, 9, 102; 340/177 VA, 201 R, 208

[56] References Cited
U.S. PATENT DOCUMENTS

| | | | |
|---|---|---|---|
| 3,482,755 | 12/1969 | Raciti | 228/180 X |
| 3,651,405 | 3/1972 | Whitney et al. | 340/208 X |

FOREIGN PATENT DOCUMENTS 407674  12/1973  U.S.S.R. ..................... 228/9

*Primary Examiner*—Francis S. Husar
*Assistant Examiner*—Kenneth J. Ramsey
*Attorney, Agent, or Firm*—Strimbeck & Soloway

[57] ABSTRACT

A system for measuring time/temperature profiles of a mass soldering operation is described. In accordance with the invention a data probe and miniature transmitter is carried through the soldering operation on top of the circuit board being soldered. A plurality of probes are attached to various components, component leads and selected board areas and provide electrical signals in response to the temperature and dwell time the components and board are subjected to during preheating and soldering. The temperature of the solder at the point the solder contacts the board may also be detected. The electrical signals are wireless transmitted, e.g. by means of low frequency electromagnetic transmission, to a remote stationary receiver for integration and display.

22 Claims, 7 Drawing Figures

MASS SOLDERING CONTROL SYSTEM

The present invention relates to the assembly of electrical and electronic components onto printed circuit boards, and more particularly to a system for monitoring the time and temperature characteristics of a mass soldering operation.

Demand for printed circuit assemblies in large quantities has resulted in increased use of automatic mass soldering systems. Moreover, recent trends toward relatively higher density circuit designs, multiple level boards, and the increased use of temperature sensitive components have increased the problems of controlling mass soldering operations to achieve high quality and reliable solder connections with high productivity. Generally, mass soldering of electrical and electronic components onto circuit boards is accomplished by bringing the underside of a board and the ends of the component leads depending therefrom in contact with a mass molten solder, e.g. as by dipping the underside of the board and depending lead ends in contact with a pool of molten solder, or by passing the board underside and depending lead ends in contact with the upper end of a standing wave of molten solder according to a technique which the art refers to as "mass wave soldering". The molten solder wets the metallic areas of the board and the component leads, rises in the board plated-through holes, and forms a mechanical and electrical connection between the leads, board and circuit lands.

As used herein the term "component lead" refers to that part of a metallic conductor of an electrical or electronic component that is joined to a printed circuit pattern, i.e. the component leads, terminals, lugs, etc. The term "land" as used herein refers to that part of the metallic pattern on the printed circuit to which the lead is joined.

Typically, a circuit board is loaded and mass soldered as follows: First the components are assembled in position on the board with the component leads extending through apertures in the board. A flux material is then applied to the board bottom surface and the depending component leads, e.g. as by spraying, brushing, foaming or by passing the board bottom surface through a standing wave of liquid flux. Following application of the flux the circuit board is preheated to activate the flux and drive off flux solvent. Preheating also serves to reduce heat shock during the mass soldering step which follows immediately thereafter. The flux cleansed and preheated circuit board is then brought in contact with molten solder by passing the underside of the board through the upper end of a standing wave of molten solder. The molten solder in the wave further heats the printed circuitry and the component leads, drives the flux up into the board plated-through holes and around the leads, and wets the metallic areas of the board, the board plated-through holes, and the component leads by solder. The board then passes from contact with the molten solder, whereupon the solder on the board and leads cools and hardens and thereby permanently mechanically and electrically connects the components by their leads to the circuit board.

The entire sequence of operations of fluxing, preheating and soldering generally are performed in-line using a moving conveyor to carry the circuit board into and through the aforesaid various operations.

The conveyor speed generally is determined by the requirements of the soldering step. The solder wave is called upon to perform a plurality of functions including serving as a heat sink, heat transfer medium, and as means for controllably transferring a predetermined quantity of molten solder to the circuit board and component leads being soldered. Moreover, the solder wave must promote rapid and complete wetting by solder of the metal surfaces it contacts, facilitate capillary penetration and solder rise into the plated through holes on the board and around the component leads, and (once the solid fillets have been formed) the wave should separate from the circuit board by appropriate drainage and "peel back" of the solder from the non-wetting surfaces so as not to leave undesirable solder build up, icicles, bridges, flags or peaks on the board, or entrapped foreign matter in the soldered joint. Insufficient solder dwell time and/or too low preheating or soldering temperature may lead to poor soldering results for a variety of reasons. On the other hand, preheating and soldering temperature should be as low as possible, and solder dwell time should be as short as possible to maximize production throughout while minimizing risk of delaminating the board and/or damaging any temperature sensitive components which may be carried on the board. Generally, the art considers that an ideal temperature for mass soldering is about 57.5° C. above the melting point of the solder alloy. Thus for a typical wave soldering operation employing Sn 63 solder (63 wt. % tin, 37 wt. % lead) (m.p. 182.3° C.) the ideal soldering temperature is about 239.8° C. Heretofore there has not been any convenient way to measure accurately the temperature of the molten solder in the wave at its point of contact with the circuit board, i.e. 1/32" below the surface of the wave. Measurement of the temperature of the solder in the reservoir base, e.g. by means of conventional thermometers, and/or measurement of the surface temperature of the solder, e.g. by means of infra-red thermometers, do not provide reliable and accurate indications of the temperature of the wave at the point of contact with the board. Moreover, attached wire devices for measuring the top side temperature of the circuit board during a wave soldering operation or for measuring the temperature reached by individual components are cumbersome, particularly in the case of enclosed or hooded soldering systems. Temperature crayons are easy to use; however, temperature crayons generally will merely provide an indication of the highest temperature reached in the overall soldering operation.

In the past the prior art generally had directed its efforts of improving wave soldering systems to new designs of solder fountains, i.e. to achieve smoother waves or different wave geometries. On the other hand, the inability of the art to measure and record accurately such operating parameters as temperature and time/-temperature profiles of the board and/or individual components during preheating and soldering, absolute dwell time in the solder wave, and the like, has been an obstacle to the on-line establishment and control of optimum wave soldering conditions. Thus, from a practical standpoint, most automatic wave soldering operations are adjusted in a more or less "hit-or-miss" fashion.

It is therefore a principal object of the present invention to provide a convenient and accurate method of determining the time/temperature profile of a mass soldering operation. Another principal object is to provide means for carrying out said method.

Further objects are to provide a convenient and accurate method of and means for determining the time/- temperature profiles of individual components, component leads and the circuit board in a mass soldering operation. Yet other objects of the invention are to provide a method of and means for the stated type for measuring accurately the temperature of the solder in a mass wave soldering system at the point the solder wave contacts the circuit board, and to measure accurately dwell time in the solder. Yet other objects will in part appear obvious and will appear hereinafter.

The invention accordingly comprises the processes involving the several steps and relative order of one or more such steps with respect to each other, and the apparatus possessing the features, properties and relations of elements which are exemplified in the following detailed disclosure and the scope of application of which will be indicated in the claims.

Generally, to effect the foregoing and other objects the present invention provides a data sensor and wireless transmitter for mounting onto a circuit board. The sensor comprises one or more probes for attachment to the board, component leads and/or component bodies, as desired, for gathering data relative to the time/temperature profiles of the board, leads and component bodies, respectively, to which the probes are attached. Dwell time in the solder also may be sensed. The sensed data is wireless transmitted, e.g. by means of low frequency electromagnetic wave energy to a remote receiver for display and/or recording. By employing low frequency electromagnetic wave energy no interference with normal communication signals, e.g. radio and television, results and electrical components on the board typically are not affected by the transmitted electromagnetic energy.

For a fuller understanding of the nature and objects of the present invention, reference should be had to the following detailed description taken in connection with the accompanying drawings wherein.

Figure 5A:
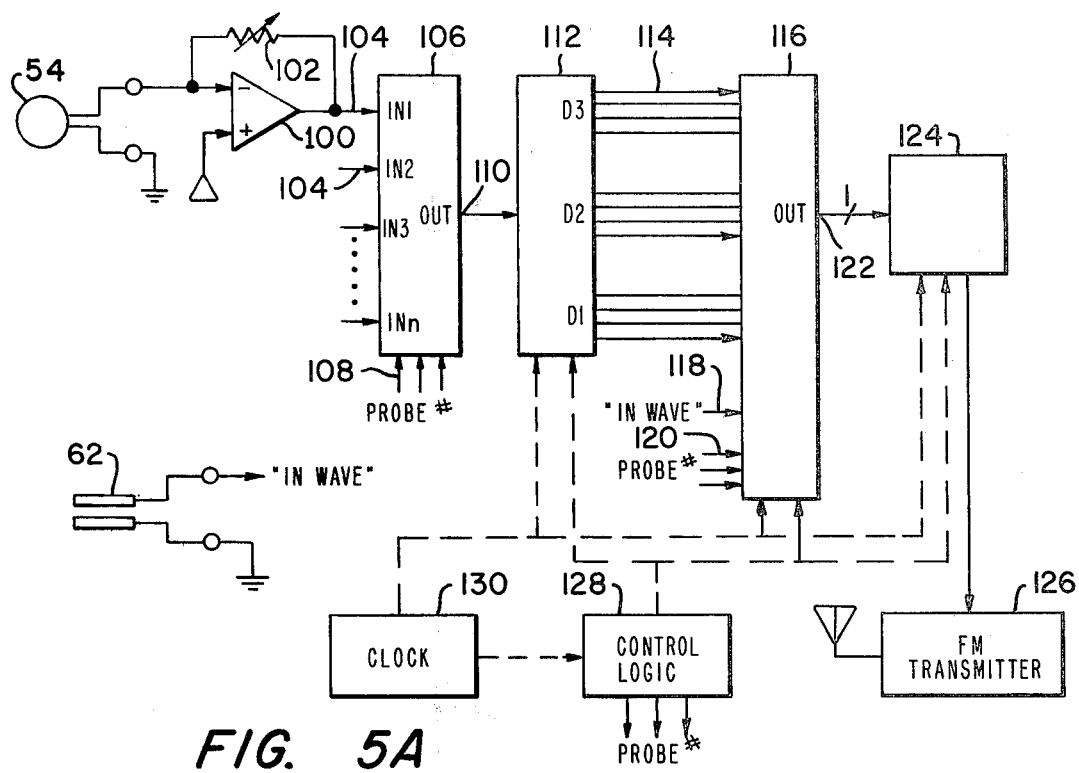
Figure 6:
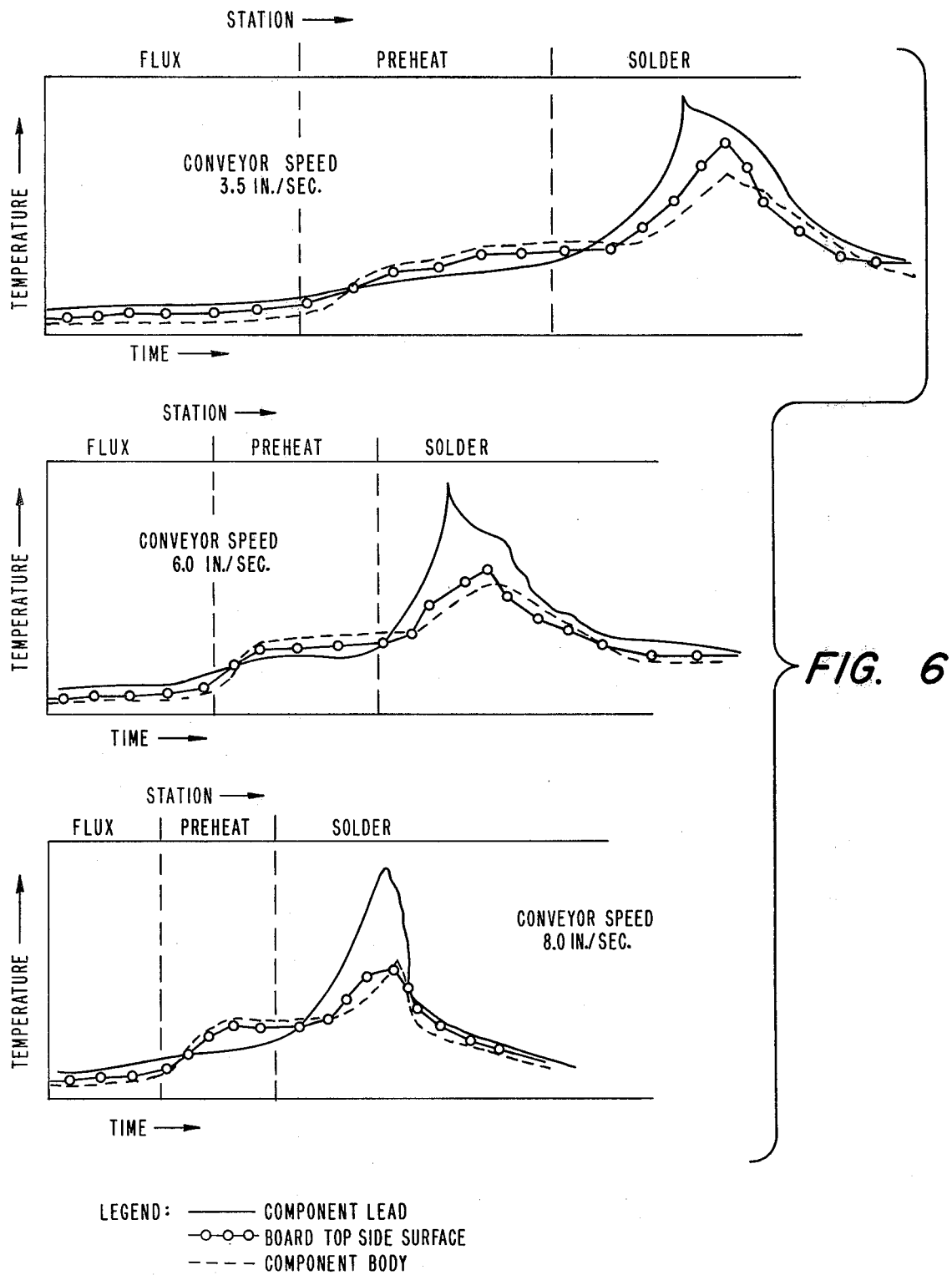

FIGS. 5A and B are block diagrams of a preferred embodiment of data sensor/wireless transmitter and remote receiver, respectively, illustrating the principals of the present invention; and FIG. 6 is a series of graphs illustrating measurements representing time/temperature profiles of the top of a board, and a component carried on that board made in accordance with the teachings of the present invention.

Figure 1:
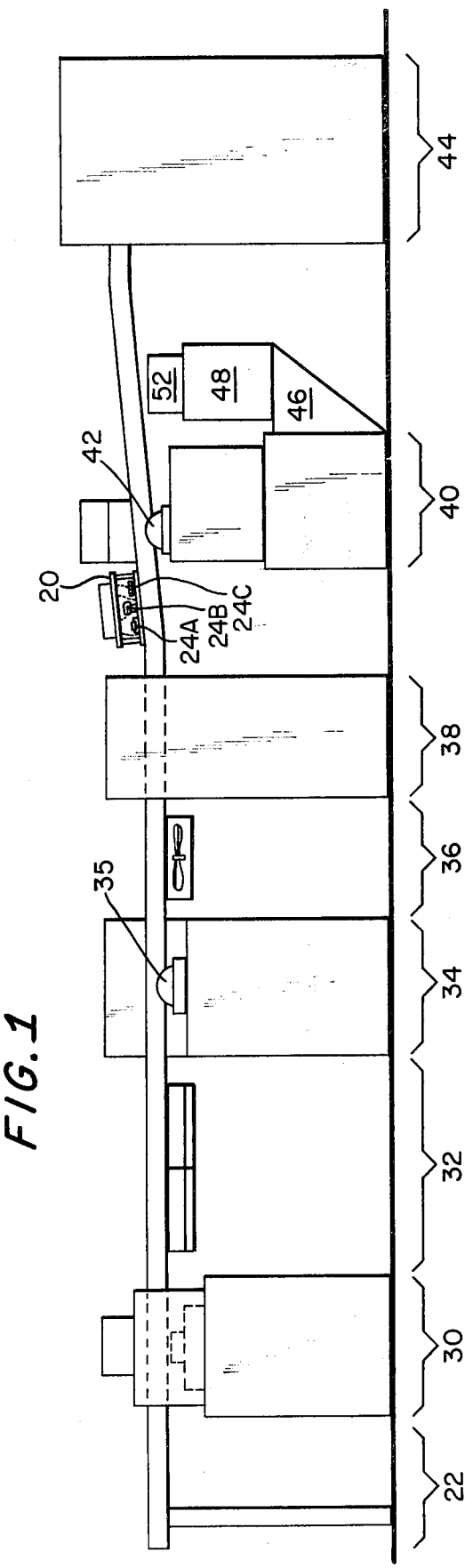
FIG. 1 is a side elevational view diagramatically illustrating an integrated soldering system in accordance with the present invention.

In the several drawings like numerals refer to like parts:

A typical automatic wave soldering and processing system is diagramatically illustrated in FIG. 1. The illustrated system comprises an integrated mass soldering system of the type available commercially from Hollis Engineering, Inc., of Nashua, N.H. The processing system includes an assembly station 22 in which the circuit boards 20 are loaded with electrical and electronic components 24A, 24B, 24C at predetermined positions on the board. The circuit boards are of conventional construction, and, for the purposes of illustration boards 20 comprise two-sided circuit boards with plated-through holes. The components, which also are of conventional type may be inserted in the board by any method known in the art which may include manual assembly, semi-automatic, or automatic assembly which may comprise single station or multiple-station pantagraph or numerically controlled machines all of which are well known in the art and need not be further described. It will be noted that at this stage components 24A, 24B, 24C are loosely mounted in the circuit board 20 with their leads 26 depending through holes 28 in the board. (see FIG. 2).

The board and loosely mounted components are then passed to a flux station 30 where a flux is applied onto the bottom of the board and the component depending leads. The flux may be any flux well known in the art and may include, for example, a water-white rosin flux, an activated rosin flux or a water-soluble flux.

The fluxed board is then passed to a preheating station 32 where the board is heated from the bottom to a top side temperature of about 110° C. to activate the flux and drive off the bulk of the flux solvent. The preheated board is then passed to a so-called "STABILIZER BASE" 34 wherein the board bottom surface and depending component leads are passed in contact with the upper end of a standing wave of molten wax 35. The board is then passed to a cooling station 36 where the waxed board is cooled sufficiently to solidify the wax and thereby lock the components in position relative to the board according to the so-called "STABILIZER PROCESS" (the terms "STABILIZER", "STABILIZER BASE" and "STABILIZER PROCESS" all are trademarks of Hollis Engineering, Inc., of Nashua, N.H.). Further details of the "STABILIZER PROCESS" are given in U.S. Pat. No. 3,973,322 issued Aug. 10, 1976 to Kenneth G. Boynton. The cooled board is then passed to a lead cutting station 38 wherein the component leads are trimmed to finished length.

The board is then passed to a wave soldering station 40 wherein the board bottom surface and depending component leads are passed in contact with the upper end 42 of a standing wave of molten solder. The solder melts and displaces the wax from the board and leads, heats the printed board and leads, drives flux further into plated through holes 28, and substantially simultaneously wets metallic areas on the bottom of the board, plated through holes, and the lower ends of the component leads. Following soldering the board is passed to an automatic cleaning and drying station 44 where flux residues, etc. are removed from the board. The entire system is interconnected by a conveyor transporting system of known type which is adapted to carry the circuit board being soldered from assembly station 22 through fluxing station 30, preheating station 32, STABILIZER BASE 34, cooler 36, lead cutter 38, wave soldering station 40 and cleaning and drying station 44. As seen in FIG. 1, the transporting assembly is inclined at a slight angle relative to the horizontal, e.g. about 7°, for passing through wave soldering station 40. The transportation assembly is mechanically coupled through a drive shaft (not shown) to a main power transmission 46. The entire system is controlled from console 48.

Figure 2:
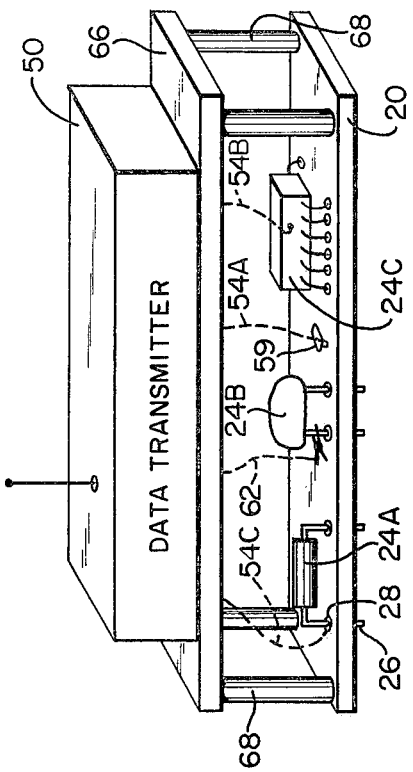
FIG. 2 is an enlarged perspective view, showing a circuit board assembly with a data sensor/wireless transmitter in accordance with the present invention.
Figure 3:
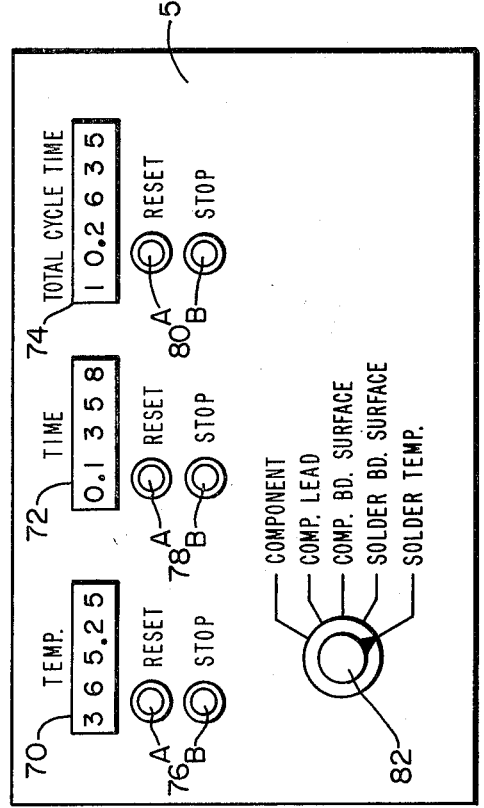
FIG. 3 is a front elevational view of one form of data receiver and display in accordance with the present invention.
Figure 4:
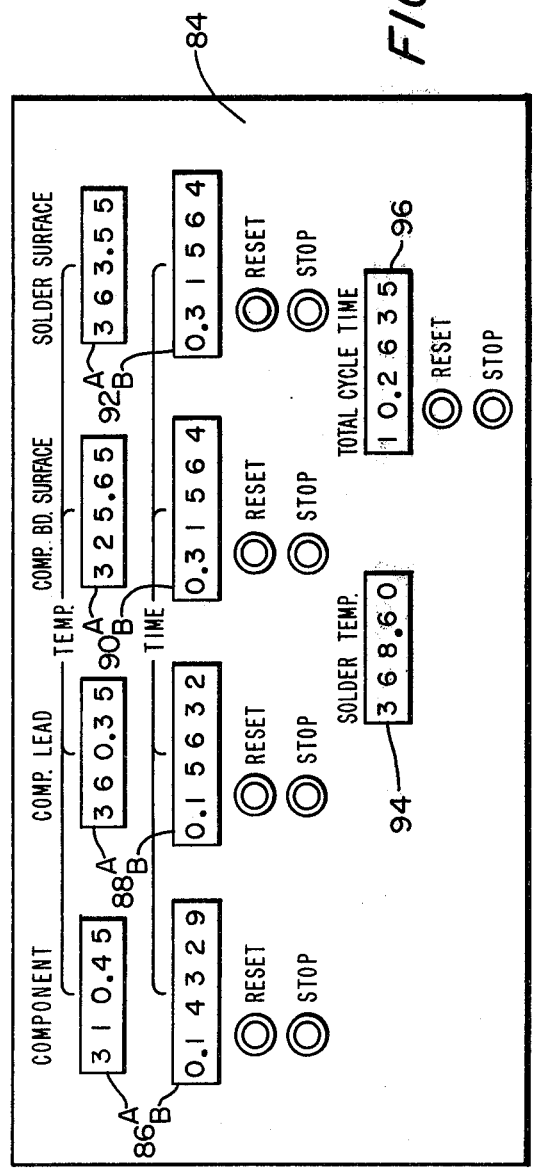
FIG. 4 is a front elevational view illustrating an alternative form of data receiver and display in accordance with the present invention.

Referring to FIGS. 2-4, the temperature of the soldering operation, time/temperature profiles of individual components and of the circuit board during soldering, and dwell time in the solder wave is measured in accordance with the present invention by a novel sensing and display system. The novel sensing and display system comprises a combination data sensor/wireless transmitter indicated at 50 and a remote data receiver and display indicated at 52. Data sensor/wireless transmitter 50 is adapted to be carried "piggy back" on a circuit board 20 through the soldering operation. Data display 52 may be adapted for permanent installation, e.g. in control console 48. Alternatively data display 52 may comprise a self-contained, portable unit.

Referring in particular to FIG. 2, data sensor/wireless transmitter 50 is adapted to produce low frequency electromagnetic signals as a function of temperature at selected positions on the board and/or the components. Thus, in accordance with the present invention data sensor/wireless transmitter 50 includes a plurality of temperature sensors 54A, 54B, 54C positioned at selected locations on the board and/or the components. For example, the illustrated data sensor/wireless transmitter 50 includes a first temperature sensor 54A attached directly to the board 20, e.g. as by means of aluminum tape 59; a second temperature sensor 54B taped to the main body of a component 24C; and, a third temperature sensor 54C taped to one of the leads on component 24A. While the exact construction of temperature sensors 54 is not critical to the present invention, the temperature sensors preferably produce electrical signals representative of the temperatures sensed and are characterized by: (1) rapid response time, (2) stability and reproducibility (so that the electrical signal produced does not change with time), (3) corrosion resistance (so that the sensor will not deteriorate or change properties under fluxing, preheating, soldering or post soldering cleaning conditions), (4) sensitivity (so that the electrical signal change per degree temperature change is readily preceptible), (5) response within the expected temperature range, (6) ruggedness for long life, and (7) relatively low manufacturing cost. Various types of thermistors are available commercially and provide the above characteristics.

Data sensor/wireless transmitter 50 also includes means for sensing board dwell time in the solder. The solder dwell sensing means comprises an electrical continuity probe 62 for sensing grounding contact with the molten solder. Probe 62 may be attached to a component lead, e.g. on component 24B as by taping or clipping to the lead. Alternatively, probe 62 may be adapted to be inserted into an open hole on the board, and to protrude below the bottom of the circuit board for a short distance, e.g. similar to a typical component lead. In the latter case probe 62 preferably will be formed of a material which will not be wetted by the molten solder so that the probe will not become soldered to the board.

Completing the data sensor/wireless transmitter 50 is a miniaturized FM transmitter which is adapted to transmit relatively low energy, low frequency electromagnetic signals as functions of electrical signals received from temperature sensors 54, and from continuity probe 62. The manner in which such electromagnetic signals are derived and transmitted will be described in detail hereinbelow.

Data sensor/wireless transmitter 50, temperature sensors 54 and continuity probe 62 are all mounted on a small substrate board 66. The latter is provided with standoffs or legs 68 at its corners for supporting the board 66 vertically spaced above the circuit board 20 and components 24A, 24B, 24C being soldered.

Referring also to FIG. 3, a signal receiver and data display unit 52 is fixedly located in control console 48. Unit 52 includes a receiver which is tuned to the frequency of the signals transmitted by transmitter 50, and is adapted to feed a digital temperature display means 70 and digital time display means 72 and 74. It will be understood, however, that unit 52 may be adapted to feed other types of display means such as a meter display, strip recorder or the like. Associated with each display 70, 72, 74 are a pair of stop and reset control means 76A,B, 78A,B and 80A,B, respectively. Completing the signal receiver and display unit 52 are a power source (not shown) and a selector means 82 for linking the feed from a selected sensor or sensors to display means 70, 72.

An alternative embodiment of signal receiver and display unit 84 is illustrated in FIG. 4. As seen in the drawing signal receiver and display unit 84 illustrated in FIG. 4 includes a plurality of display means 86A,B, 88A,B, 90A,B, 92A,B, 94 and 96 so that feeds from a plurality of sensors may be displayed simultaneously.

A block diagram of a preferred form of data sensor/transmitter and remote signal receiver and display is shown in FIG. 5. In this form of the invention the analog output of the temperature sensors is converted to digital form and all subsequent processing is digital. The data sensor/transmitter 50 is shown in FIG. 5A.

The temperature sensors 54, used in the preferred embodiment of the invention, are silicon semiconductor diodes. Each sensor has one end connected to ground and the other end connected to the negative input of an operational amplifier 100 (only one being shown in FIG. 5A for ease of illustration). The positive input of operational amplifier 100 is connected to a predetermined reference voltage while the feedback loop of amplifier 100 is provided with variable resistor 102 for varying the gain of the amplifier. As well known in the art, amplifier 100 forward biases sensor 54 so that an analog signal output of amplifier 100 is representative of the temperature sensed by the sensor. Preferably, the temperature coefficient of the sensors should be stable and very nearly linear over temperature range of interest.

As shown in FIG. 5A the output of the amplifier 100 is connected to an input 104 of the analog multiplexor 106. Analog multiplexors are well known in the art. Generally, multiplexor 105 is of the type that has two types of inputs (branch inputs provided at input terminal 104 and address inputs provided at input terminals 108) and a single output provided at terminal 110. Only one branch input can be transmitted through the multiplexor at a time depending upon the address provided at the address input terminals. In the preferred embodiment, multiplexor 106 is provided with a three bit address input from logic circuit 128 and accordingly, depending on the address input, will select and provide at its output terminal 110 one of the branch inputs from the corresponding input terminals 104. The output of multiplexor 106 is connected to an analog-digital converter 112. Converter 112 is well known in the art and essentially converts each analog signal appearing at the output of multiplexor 106 to a parallel binary signal over output lines 114. Output lines 114 are connected to corresponding input terminals of a parallel-to-serial data register 116. Register 116 is also connected to receive at its input terminal 118 the "in wave" signal from wave sensor 62 and at its input terminals 120 the address signal from logic circuit 128, the address signal being simultaneously received at the address input terminals 108 of multiplexor 106. As well known in the art the register 116 empties one bit at a time so as to convert the parallel binary input to a serial binary output at output terminal 122. Output terminal 122 is connected to the input of a modulator 124, preferably of the frequency shift keying (FSK) type. FSK modulation and transmission is well known in the art. For example, see Fink, Donald G., Editor-in-Chief; *Electronics Engineers' Handbook;* McGraw-Hill Book Company, New York, N.Y.; 1975, Pages 14–46 and 14–47. The output of modulator 124 is connected to an FM transmitter 126 for transmitting the output of modulator 124.

The carrier signal used in the modulation and transmission process is preferably chosen at a low frequency, so that the signal transmitted will not interfer with radio transmission signals, and is at sufficiently low energy levels so that it is below FCC requirements. By way of example, but not limitation, a carrier frequency of 90 MHz and a power level of transmission of 0.1 milliwatts is satisfactory for most applications. Control logic 128 provides the address signals to the input terminals 108 of multiplexor 106 and input terminals 120 of register 116. It will be appreciated that the sequencing of address signals is dependent upon the desired sequencing in which the signals provided by sensors 54 are transmitted through the multiplexor 106. This in turn is predetermined by the user, and therefore logic circuit 128 has not been shown in detail. It is submitted that such logic would be obvious to one skilled in the art.

Clock 130 provides the necessary clocking signals to the converter 112, register 116, modulator 124 and logic circuit 128 in order to synchronize the various components and may include any type of means for providing clocking signals such as a timing crystal oscillator.

Figure 5B:
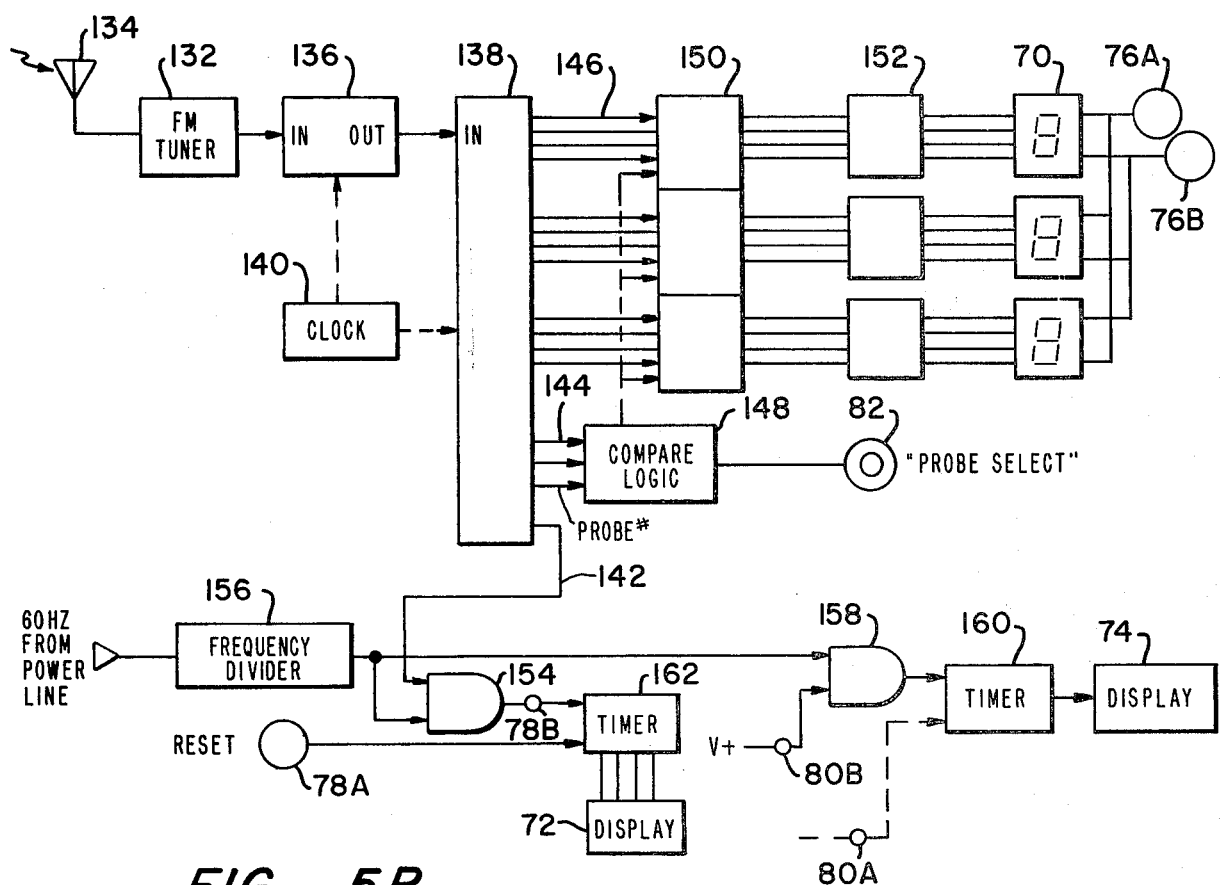

Referring to FIG. 5B the receiver receives a signal output of FM transmitter 126 and is designed to provide, inter alia, a display representative of the temperature of the particular sensor 54 which is provided by selector means 82. More specifically the receiver comprises FM tuner 132 which in turn receives signals from antenna 134. The latter is designed to receive energy within the frequency range transmitted by FM transmitter 126. The output of tuner 132 is connected to the input of demodulator 136 which, in turn, is connected to the input of a serial-to-parallel binary signal converter 138. Demodulator 136 is preferably an FSK demodulator consistent with the modulation process provided by modulator 124 of the transmitter. A clock 140 is provided to synchronize the modulator 126 with converter 138. The output of demodulator 136, is preferably in a serial binary form and is sequenced to provide the in-wave signal (representative of the signal originally provided by probe 62) at the output 142 of the converter 138, the address signal (representative of the signal originally provided by logic circuit 128) at the output terminals 144 of converter 138 and the parallel binary signal (corresponding to the temperature measurement of the corresponding sensor 54) at the output 146 of converter 138.

The output signals provided at output terminals 144 are transmitted to the input of compare logic circuit 148, while the parallel binary data signals provided at the output terminals 146 of converter 148 are connected to the inputs of latches 150. An output is provided from circuit 148 to the enable inputs of latches 140. As well known in the art, latches 150 hold the values of the outputs from the outputs 146 of converter 138 and will only transmit these data signals through to its outputs when enabled by an enable signal from circuit 148. The output of latches 150 are connected to decoders 152 the latter being designed to convert the binary outputs of latches 150 to a signal of the type which can be measured by display means 70. The output of decoder 152 is accordingly transmitted to the display means 70. The appropriate reset control means 76A and 76B are appropriately connected to display means 70 in order to reset or hold any values shown on the particular displays. In order to time the total cycle as provided on display 74 and the dwell time on display 72, the output from terminal 142 of converter 138 of the receiver is connected to the input of and gate 154, while a 60 cycle signal is provided at the input of frequency divider 156. The digital output of frequency divider 156 is connected to a second input of gate 154 as well as to the input of and gate 158. The other input of and gate 158 is connected to one pole of a switch of control means 80B having its other pole biased by a positive voltage. The output of and gate 158 is connected to timer 160 which in turn is connected to a display 74. The output of and gate 154 is connected through a switch of control means 78B to timer 162 which is in turn connected to display means 72.

In operation each sensor 54 provides a signal which is compared to the reference voltage of amplifier 100 and applied to an input 104 and multiplexor 106. Each sensor is represented by a distinct address. Logic circuit 128 provides a sequence of signals to the addressing inputs 108 of the multiplexor so that when each address signal appears at input terminals 108, the corresponding signal at the input 104 represented by the addressing signal is transmitted to the output 110 of the multiplexor. This analog output is converted into a parallel binary signal at the output terminals 114 of converter 112. When the circuit board 20 contacts the standing wave of molten solder, sensor 62 is shorted to provide the "in wave" signal at the input terminal 118 of the register 116. The data signals provided at the input terminals 114 of register 116 are accompanied by the addressing signals at input terminals 120. The register 116 provides a serial binary output from output terminal 122 to the modulator 124. The signal is modulated with a carrier frequency and transmitted by transmitter 126.

Each address and corresponding data signals as well as the "in wave" signal, are received by antenna 134 and tuner 132 of the receiver. The signal is demodulated so that the carrier frequency is removed by demodulator 136. Clock 140 clocks the demodulated signal into converter 138 so that the parallel binary signal appears at outputs 146, 144 and 142 of the converter. The output signal 142 which indicates that the board has contacted the standing wave enables and gate 154 so that each pulse provided by frequency divider 156 is counted by timer 162. This, in turn, is representative of the time the board is contacting the standing wave. It will be appreciated that once the board is no longer contacting the wave the in wave signal will no longer appear at output terminal 142, and and gate 154 will be disabled so that timer 162 will hold the count which is displayed on display 72. The timer can be reset by means 78A or stopped by throwing the switch of means 78B. Similarly and gate 158 is enabled so long as the switch of means 80B is closed. The timer 160 will therefore count each pulse from frequency divider 156 keeping track of the toal cycle time. Should it be desired to freeze timer 160 one need only throw the switch of means 80B disconnecting the positive voltage from the and gate 58 so that the latter is disabled. This in turn freezes the display on display 74. The timer can be reset by the switch of means 80A as previously described.

Where it is desired to display the particular temperature measured by a particular sensor, that sensor is selected by the selector means 82 which in turn sets the compare logic circuit 148. This enables the compare logic circuit to compare the address output 144 to determine which data signals appear at output signals 146. Where the address signal appearing at output terminal 144 corresponds to the particular sensor an enable signal is provided by compare logic circuit 148 to the latches 150. Once enabled the data signal provided by latches 150 are transmitted to the decoder 152 and in turn displays 70.

It will be appreciated that the circuits used to realize the functional blocks of FIG. 5 can take a number of forms as would be obvious to those skilled in the art.

FIG. 6 shows a series of graphs showing the time/temperature measurements made in accordance with the teachings of the present invention, of a printed circuit board, component lead and component body undergoing an integrated soldering operation from fluxing through preheating and mass soldering at three different conveyor speeds.

Certain changes will be obvious to one skilled in the art and may be made in the above disclosure without departing from the scope of the invention herein involved. For example, the signals from the various temperature and solder dwell probes may be transmitted continuously on separate FM channels to a receiver/display which is capable of receiving and processing the various signals simultaneously. Moreover, signals deriving from the various probes may be fed into a microprocessor (not shown) and the output therefrom may be used to adjust various operating parameters of the soldering process. For example, preheat and/or solder temperature may be adjusted by switching the appropriate heaters in order to achieve a desired temperature. Conveyor speed may also be adjusted. Apparatus for implementing such adjustments and others may be made in various well known ways, depending on the particular requirements of the situation. Still other modifications will be obvious to one skilled in the art. Accordingly, it is intended that all matter contained in the above description or shown in the accompanying drawings shall be interpreted in an illustrative and not in a limiting sense.

I claim:

1. In combination with a mass soldering machine having a solder base adapted to contain a mass of molten solder and conveyor means for transporting a circuit board past said solder base whereby to contact said circuit board at least in part with molten solder in said base, a data sensor and wireless transmitter for carrying on top of the circuit board, said data sensor being adapted to provide a signal as a function of the dwell time said board or a component carried on said board is in contact with said molten solder, and a remote receiver tuned to the frequency of said transmitter.

2. Apparatus as claimed in claim 1 wherein said transmitter is adapted to transmit relatively low frequency, low power electromagnetic waves.

3. Apparatus according to claim 1 wherein said data sensor for providing a signal as a function of dwell time comprises an electrical continuity probe.

4. Apparatus according to claim 1 wherein said data sensor also includes one or more temperature sensors which are adapted to provide signals as a function of temperature.

5. Apparatus according to claim 1 or claim 4 wherein said receiver includes display means for providing a visual data display.

6. Apparatus according to claim 4 further including preheating means positioned upstream of said solder base.

7. Apparatus according to claim 6 and further including means responsive to measurements made by said data probe for adjusting the temperature of said preheating means within predetermined parameters.

8. Apparatus according to claim 6 and further including means responsive to measurements made by said data probe for adjusting the linear speed of said conveyor means within predetermined parameters.

9. Apparatus according to claim 4 wherein said one or more temperature sensors comprise one or more thermistors.

10. Apparatus according to claim 4 and further including means responsive to measurements made by said data probe for adjusting the temperature of said solder base within predetermined parameters.

11. Apparatus according to claim 4 and further including means responsive to measurements made by said data probe for adjusting the linear speed of said conveyor means within predetermined parameters.

12. In a method of monitoring a component carrying printed circuit board through a mass soldering operation in contact with a mass of molten solder, the steps of: (1) providing (A) a data sensor and a wireless transmitter for carrying on a board being processed, and (B) a remote receiver tuned to the frequency of said transmitter; (2) attaching said data sensor to said board or a component carried on said board; (3) generating a signal as a function of the dwell time said board or said component is in contact with said molten solder, and (4) wireless transmitting said signal to said remote receiver.

13. In a method according to claim 12, wherein said signals comprise relatively low frequency, low energy electromagnetic waves.

14. In a method according to claim 12, including the steps of: (5) providing at least one temperature responsive data sensor and attaching the same to said board or a component carried on said board and (6) deriving an electrical signal as a function of the temperature of the board or component to which said temperature responsive data sensor is attached.

15. In a method according to claim 14, wherein said temperature responsive data sensor comprises a thermistor which provides an electrical analogue signal as a function of the temperature of the board or component to which it is attached, and including the step of converting said analogue signal to a digital signal.

16. In a method according to claim 14, and including the step of converting signals received by said receiver to a visual display of temperature.

17. In a method according to claim 14, and including the step of adjusting the temperature of said molten solder responsive to said temperature function signal.

18. In a method according to claim 14, wherein said circuit board is preheated prior to said mass soldering operation, and including the step of adjusting the temperature of said preheating responsive to said temperature function signal.

19. In a method according to claim 14, wherein said circuit board is preheated prior to said mass soldering operation, and including the step of adjusting the time of said preheating responsive to said temperature function signal.

20. In a method according to claim 12, and including the step of adjusting said dwell time responsive to said dwell time function signal.

21. In a method according to claim 12, wherein said data sensor for providing a signal as a function of said dwell time comprises a continuity probe for sensing grounding contact with said molten solder, and including the step of deriving a digital signal for the time said sensor is in contact with said molten solder.

22. In a method according to claim 12, and including the step of converting signals received by said receiver to a visual display of dwell time.

* * * * *